United States Patent
Pavageau

(10) Patent No.: US 9,048,523 B2
(45) Date of Patent: Jun. 2, 2015

(54) RF MEMS CROSSPOINT SWITCH AND CROSSPOINT SWITCH MATRIX COMPRISING RF MEMS CROSSPOINT SWITCHES

(75) Inventor: Christophe Pavageau, Villeneuve d'Ascq (FR)

(73) Assignee: DELFMEMS, Villeneuve D'ascq (FR)

( * ) Notice: Subject to any disclaimer, the term of this patent is extended or adjusted under 35 U.S.C. 154(b) by 0 days.

(21) Appl. No.: 14/001,602

(22) PCT Filed: Mar. 20, 2012

(86) PCT No.: PCT/EP2012/054864
§ 371 (c)(1),
(2), (4) Date: Aug. 26, 2013

(87) PCT Pub. No.: WO2012/130664
PCT Pub. Date: Oct. 4, 2012

(65) Prior Publication Data
US 2014/0009244 A1 Jan. 9, 2014

(30) Foreign Application Priority Data
Mar. 28, 2011 (EP) .................................... 11160016

(51) Int. Cl.
*H01P 1/15* (2006.01)
*H01H 59/00* (2006.01)
(Continued)

(52) U.S. Cl.
CPC .............. *H01P 1/15* (2013.01); *H01H 1/0036* (2013.01); *H01H 1/20* (2013.01); *H01H 59/0009* (2013.01);
(Continued)

(58) Field of Classification Search
CPC ........... H01P 1/15; H01P 1/127; H01P 3/003; H01H 59/0009; H01H 1/20; H01H 2001/0084; H01H 2001/0063; H01H 1/0036; H01H 2059/0072
USPC ................................ 333/105, 106, 107, 24 R
See application file for complete search history.

(56) References Cited

U.S. PATENT DOCUMENTS 5,463,233 A * 10/1995 Norling ......................... 257/254
6,888,420 B2 5/2005 Schaffner et al.
(Continued)

FOREIGN PATENT DOCUMENTS

EP 1 705 676 A1 9/2006
EP 2 110 881 A1 10/2009

OTHER PUBLICATIONS

International Search Report (four pages) and Written Opinion (five pages) for PCT/EP2012/054864, mailed May 25, 2012; ISA/EP.
European Search Report (three pages) for EP 11 16 0016, completed Oct. 14, 2011; Munich.

*Primary Examiner* — Jung Kim
(74) *Attorney, Agent, or Firm* — Harness, Dickey & Pierce, P.L.C.

(57) ABSTRACT

The RF MEMS crosspoint switch comprising a first transmission line and a second transmission line that crosses the first transmission line; the first transmission line comprises two spaced-apart transmission line portions, and a switch element that permanently electrically connects the two spaced-apart transmission line portions; the second transmission line crosses the first transmission line between the two spaced-apart transmission line portions; the RF MEMS crosspoint switch further comprises actuation means for actuating the switch element at least between a first position, in which the switch element is electrically connecting the two spaced-apart transmission line portions of the first transmission line and the first and second transmission lines are electrically disconnected, and a second position, in which the switch element is electrically connecting the two spaced-apart transmission line portions of the first transmission line and is also electrically connecting the two transmission lines together.

13 Claims, 5 Drawing Sheets

(51) Int. Cl.
   *H01P 1/12*   (2006.01)
   *H01P 3/00*   (2006.01)
   *H01H 1/00*   (2006.01)
   *H01H 1/20*   (2006.01)

(52) U.S. Cl.
   CPC .............. *H01H 2001/0063* (2013.01); *H01H 2001/0084* (2013.01); *H01H 2059/0072* (2013.01); *H01P 1/127* (2013.01); *H01P 3/003* (2013.01)

(56) References Cited

U.S. PATENT DOCUMENTS

| | | | |
|---|---|---|---|
| 6,984,870 B2 * | 1/2006 | Kinayman | 257/539 |
| 7,146,067 B2 * | 12/2006 | Despont et al. | 385/16 |
| 2003/0090350 A1 | 5/2003 | Feng et al. | |
| 2004/0095205 A1 | 5/2004 | Schaffner et al. | |
| 2009/0286491 A1 | 11/2009 | Ziaei et al. | |

\* cited by examiner

RF MEMS CROSSPOINT SWITCH AND CROSSPOINT SWITCH MATRIX COMPRISING RF MEMS CROSSPOINT SWITCHES

CROSS-REFERENCE TO RELATED APPLICATIONS

This application is a 371 U.S. National Stage of International Application No. PCT/EP2012/054864, filed Mar. 20, 2012, and claims priority to European Patent Application No. 11160016.9, filed Mar. 28, 2011. The entire disclosures of the above applications are incorporated herein by reference.

TECHNICAL FIELD

The present invention relates to the field of Radio Frequency (RF) micro electromechanical systems (MEMS). In this field, the invention relates to a novel RF MEMS crosspoint switch and to a novel M×N crosspoint switch matrix comprising several crosspoint switches, where M is the number of row transmission lines and N is the number of column transmission lines.

PRIOR ART

The routing of RF signals can be accomplished by using a RF MEMS crosspoint switch matrix that is adapted to map for example M signals input ports into N signal output ports. A M×N crosspoint switch matrix comprises M row (or column) transmission lines that form the signal input ports and N column (or row) transmission lines that cross transversally the row (or column) transmission lines and that form the output ports. Any column transmission line of the matrix can be electrically connected to any row transmission line by simply switching to the ON-state a RF MEMS crosspoint device. The crosspoint switch matrix is a simple architecture historically used in early telephony systems, and can be advantageously used in any telecommunication systems for routing RF signals.

U.S. Pat. No. 6,888,420 discloses a crosspoint device comprising three switching elements. FIG. 2 shows an example of crosspoint switch matrix disclosed in said U.S. Pat. No. 6,888,420 and comprising said particular crosspoint device with three switching elements S1, S2, S3 for each crosspoint.

This implementation of the prior art has the major drawbacks of using three switching elements S1, S2, S3 (FIG. 2) for each crosspoint. Each switching element, whatever its technology is, has an on-state resistance that is rather low for state-of-the-art technologies. But in reference to FIG. 2, the connection between the row $RFIN_1$ to column $RFOUT_4$ meets seven times the on-resistance, which increases dramatically the insertion loss. Furthermore, the switch element S1 between the row transmission line and the column transmission line detrimentally increases the bulkiness of the crosspoint switch device.

OBJECTIVE OF THE INVENTION

An objective of the invention is to propose a novel RF MEMS switch crosspoint for crosspoint switch matrix applications or the like, said RF MEMS switch crosspoint enabling to achieve a lower insertion loss for the RF signals that are routed through a crosspoint switch matrix or the like. Said novel RF MEMS switch crosspoint is also compact and enables the construction of large switch matrices with a reduced number of switches which by consequence simplifies control.

SUMMARY OF THE INVENTION

This objective is achieved by the RF MEMS crosspoint switch of claim 1.

In the RF MEMS crosspoint switch of the invention, only one switch element can be advantageously used, which dramatically reduces the insertion loss for RF signals in switch matrix applications. Furthermore, the RF MEMS crosspoint switch of the invention can be easily constructed in a more compact way, compared to the crosspoint device disclosed in U.S. Pat. No. 6,888,420.

More particularly and optionally, the RF MEMS crosspoint switch of the invention can comprise any one of the optional characteristics of claims 2 to 11.

The invention also relates to a RF MEMS switch matrix comprising several row transmission lines, and several column transmission lines that cross the row transmission lines, said matrix comprising at each crosspoint a RF MEMS crosspoint switch of claim 1.

BRIEF DESCRIPTION OF THE DRAWINGS

The characteristics and advantages of the invention will appear more clearly on reading the following detailed description which is made by way of non-exhaustive and non limiting example, and with reference to the accompanying drawing on which.

DETAILED DESCRIPTION

Figure 1:
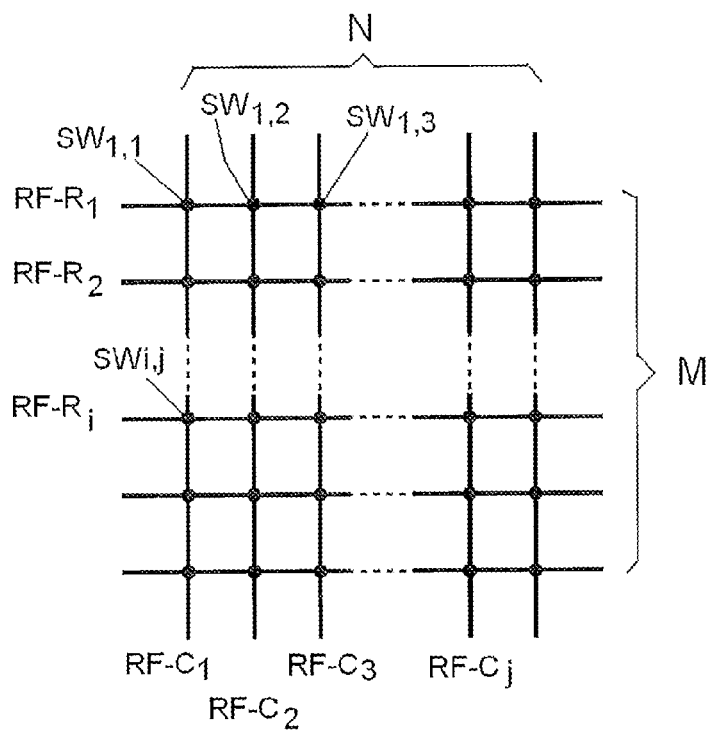
FIG. 1 is an example of crosspoint switch matrix.

In reference to FIG. 1, a M×N crosspoint switch matrix comprises M row transmission lines $RF-R_i$ forming RF signal paths and N column transmission lines $RF-C_j$, that cross the row transmission lines and form RF signal paths. At each crosspoint of two transmission lines, the matrix comprises a RF MEMS crosspoint switch $SW_{i,j}$.

Figure 3:
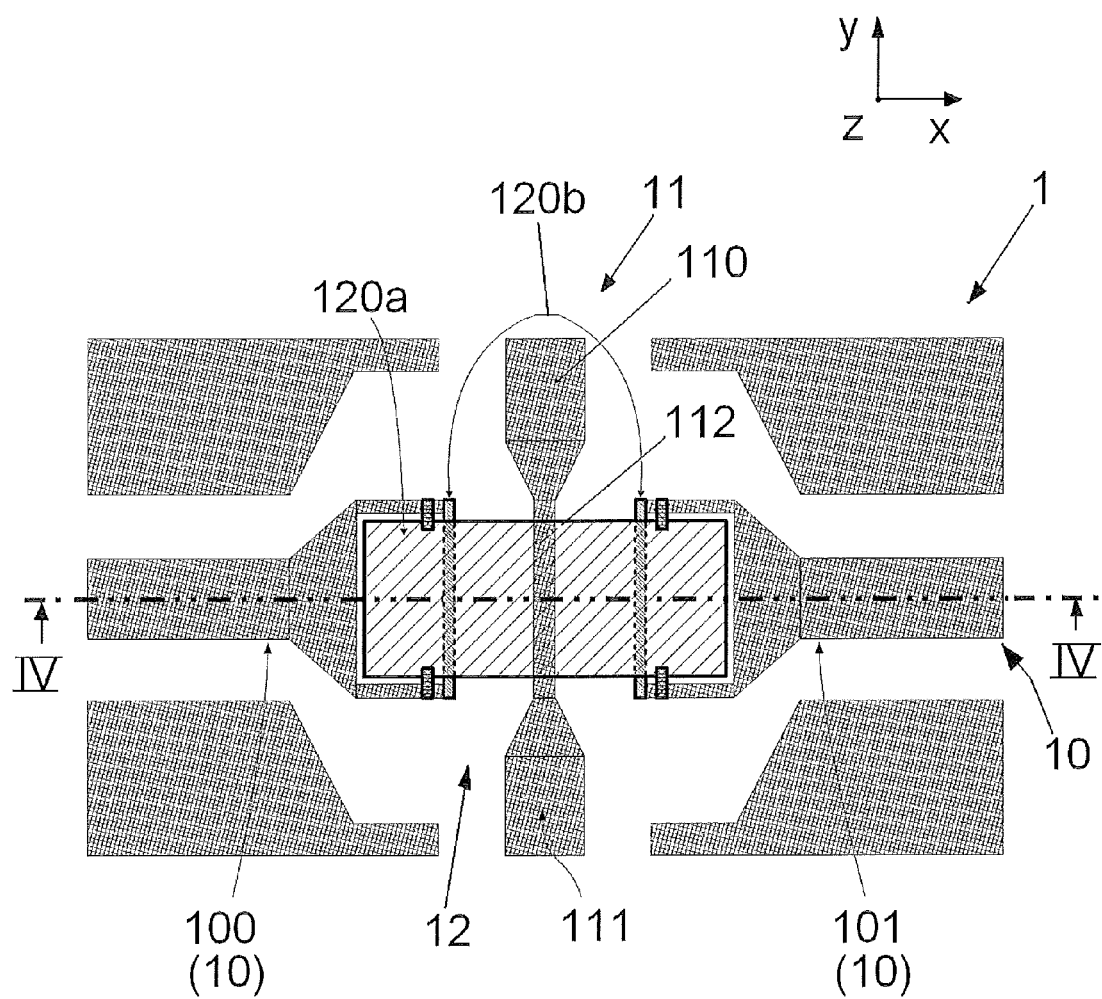
FIG. 3 is a top view of a first embodiment of a RF MEMS ohmic crosspoint switch of the invention.
Figure 4A:
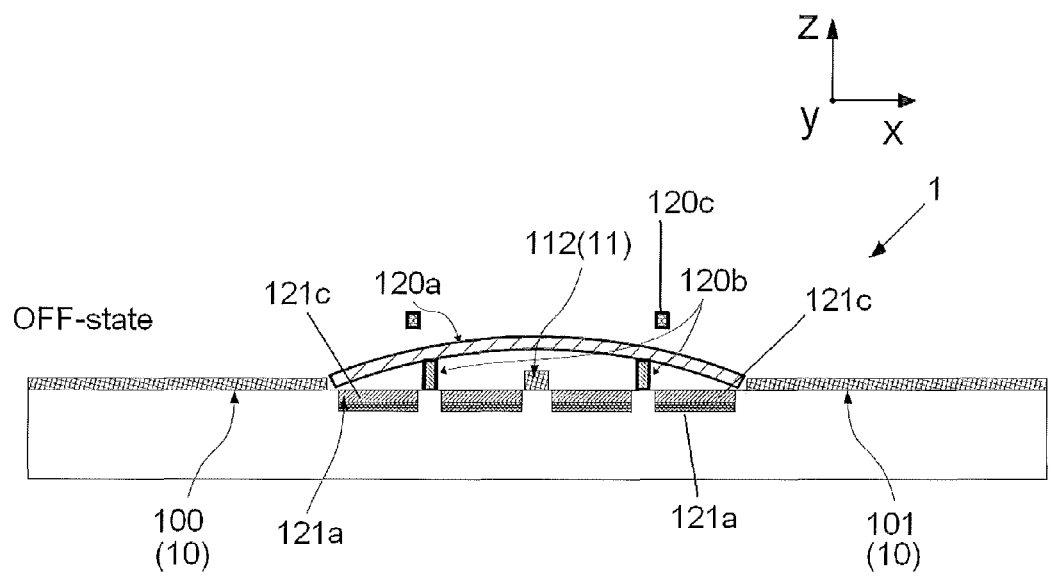
FIG. 4A is a view in cross section of the RF MEMS ohmic crosspoint switch of FIG. 3 in plane IV-IV, when the switch is in the OFF-State.
Figure 4B:
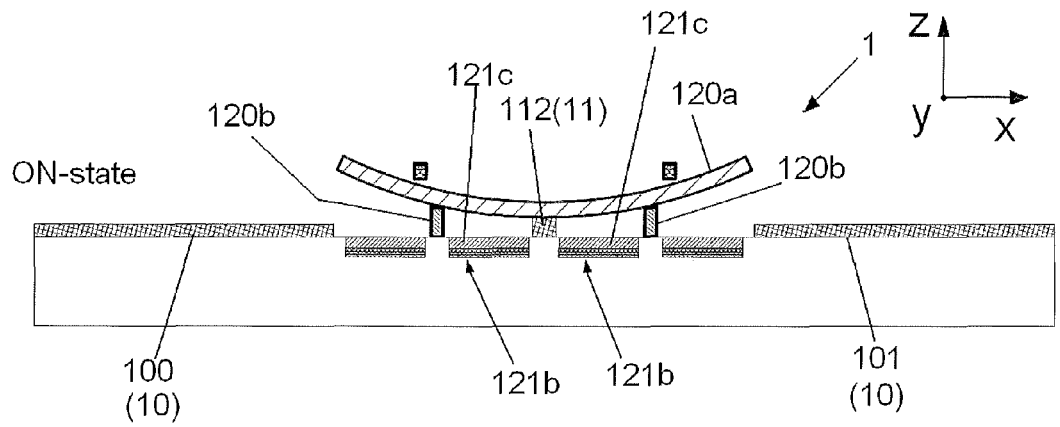
FIG. 4B is a view in cross section of the RF MEMS ohmic crosspoint switch of FIG. 3 in plane IV-IV, when the switch is in the ON-State, FIG. 5 a top view of an embodiment of a RF MEMS capacitive crosspoint switch of the invention.

FIGS. 3, 4A and 4B show an example of implementation of a RF MEMS ohmic crosspoint switch 1 of the invention, that can be used for making each crosspoint switch $SW_{i,j}$ of the crosspoint switch matrix of FIG. 1.

In reference to FIG. 3, the crosspoint switch 1 comprises a row transmission line 10 and a column transmission line 11, each transmission lines 10, 11 being adapted to transmit a RF signal trough the crosspoint switch 1. When the crosspoint switch 1 is implemented in the matrix of FIG. 1 as crosspoint switch $SW_{i,j}$, the row transmission line 10 of the crosspoint switch forms a part of the row transmission lines $RF-R_i$, and the column transmission line 11 of the crosspoint switch forms a part of the column transmission lines $RF-C_j$.

Said row and column transmission lines 10, 11 are formed onto the surface of a substrate S by using conventional micromachining technologies (i.e. bulk or surface) The substrate S is for example a wafer of silicon, silicon-on-insulator, silicon-on-sapphire, gallium-arsenide, gallium-nitride, glass, quartz, alumina or any other material used for the manufacturing of semiconductor devices. The substrate S can be furthermore but not necessary covered by a thin layer of insulating material, for example made of silicon nitride, silicon dioxide, aluminium oxide or any other dielectric layer used for the manufacturing of microelectronics devices.

The row transmission line 10 comprises two spaced-apart transmission line portions 100, 101.

The column transmission line 11 forms a non-interrupted RF signal path, and crosses the row transmission line 10 between the two spaced-part transmission line portions 100, 101.

More particularly, in the example of FIG. 3, the column transmission line 11 is made of two conductor pieces 110, 111 and a central conductor piece 112 of smaller width that permanently electrically connects the two conductor pieces 110, 111 together.

In the particular example of FIGS. 3, 4A and 4B, the transmission lines 10 and 11 are CPW (coplanar waveguide) lines, but the invention is not limited to this particular technology, and the transmission lines can be for example also grounded coplanar waveguide, microstrip lines, slot lines, strip lines, coaxial line, waveguide or any other type of transmission lines.

The RF MEMS crosspoint switch 1 comprises a switch 12. Said switch 12 comprises a switch element 120 that permanently electrically connects the said two spaced-apart transmission line portions 100, 101 of the row transmission line 10. This switch element 120 thus forms, with the said two spaced-apart transmission line portions 100, 101, a row transmission line 10 that constitutes a non-interrupted RF signal path.

The switch 12 also comprises actuation means 121 for actuating the switch element 120 between a first position, hereafter referred as the OFF-State, and a second position, hereafter referred as the ON-State.

In the OFF-State, the two transmission lines 10, 11 of the crosspoint switch are electrically disconnected while the switch element 120 is still electrically connecting the said two spaced-apart transmission line portions 101, 102 of the row transmission line 10.

In the ON-State, the switch element 120 is still electrically connecting the said two spaced-apart transmission line portions 101, 102 of the row transmission line 10, and is also electrically connecting the two transmission lines 10, 11.

In the particular embodiment of FIGS. 3, 4A and 4B, the switch element 120 is constituted by a flexible membrane 120a, that is supported by two pillars 120b and forms a bridge between the two spaced-apart transmission line portions 100, 101 of the row transmission line 10. Mechanical stops 120c are also provided above the membrane 120a. The flexible membrane 120a is not anchored at both ends but can freely slide relatively to the pillars 120b during its bending movement. This type of flexible and free switch membrane has already been described in detail in European patent application EP-A-1705676.

In reference to FIG. 4A, the actuation means 121 are electrostatic actuation means comprising buried electrodes 121a and 121b that are formed in the substrate S, underneath the switch membrane 120a. Each electrode 121a and 121b is covered by a dielectric layer 121c in order to avoid any ohmic contact between the switch membrane 120a and the electrodes 121a, 121b. In another embodiment, each electrode 121a and 121b is not covered by a dielectric layer but is separated with appropriate mechanical means from the switch membrane 120a by a thin layer of air, gas or vacuum separate, in order to avoid any ohmic contact between the switch membrane 120a and the electrodes 121a, 121b. The electrodes 121a are positioned outside the pillars 120b, underneath the two ends of the switch membrane 120a, and are used for actuating the switch membrane 120a in the OFF-state position of FIG. 4A. The electrodes 121b are positioned between the pillars 120b, and are used for actuating the switch membrane 120a in the ON-state position of FIG. 4B.

Although the use of electrostatic actuation means 121 is preferred, the invention is however not limited to this particular electric actuation technology, but other electric actuation technologies can also be used such as for example electro-magnetic, piezoelectric or electro-thermal actuation.

OFF-State—FIG. 4A

A DC signal is applied on the external electrodes 121a. These electrodes 121a thus create an electrostatic force that is attracting the two ends of the membrane 120a and that is bending up the flexible membrane 120a in the OFF-state position of FIG. 4A.

In this OFF-state position, the flexible membrane 120a is in metal-metal electrical contact with the two pillars 120b. These two pillars 120b and the flexible membrane 120a are part of the row transmission line 10, and forms with the two spaced-apart transmission line portions 100, 101a non-interrupted RF signal.

The metal-metal electrical contact (ohmic contact) between the pillars 120b and the flexible membrane 120a is obtained for example by using metallic pillars 120b, for example pillars made of aluminium, gold or any conductive alloy, and by using a metallic membrane 120a, for example a membrane made of aluminium, or gold, or copper, or any conductive alloy, or a membrane 120a whose face in contact with the pillars 120a is metallic.

In the OFF-state position, the flexible membrane 120a is not in contact with the column transmission line 11 that crosses the row transmission line 10 beneath the flexible membrane. The row transmission line 10 and the column transmission line 11 are thus electrically disconnected. A RF signal can be routed by the row transmission line 10 without being redirected in the column transmission line 11, and vice versa.

ON-State—FIG. 4B

A DC signal is applied on the internal electrodes 121b. These electrodes 121b thus create an electrostatic force that is attracting the central part of the membrane 120a, and that is bending down the flexible membrane 120a in the ON-state position of FIG. 4B.

In this ON-state position, the flexible membrane 120a is still in metal-metal electrical contact with the two pillars 120b, like in the OFF-state position. But in contrast with the OFF-state position, in the ON-state position the flexible membrane 120a is also in metal-metal electrical contact with the central portion 112 of the column transmission line 11. The row transmission line 10 is thus electrically connected by the membrane 120a with the column transmission line 11. A RF signal that is applied on the row transmission line 10 is thus routed from the row transmission line 10 to the column transmission line 11, and vice versa.

The metal-metal electrical contact (ohmic contact) between the flexible membrane 120a and the central portion 112 of the column transmission line 11 is obtained for example by using a metallic membrane 120a, for example a membrane made of aluminium, or gold or any conductive alloy, or a membrane 120a whose face in contact with the central portion 112 is metallic or comprises one or several metallic contact areas, and by using a central portion 112 whose face in contact with the membrane is metallic or comprises one or several metallic contact areas.

One or multiple metal-metal contacts can be realized between the membrane and the column transmission line 11. More particularly, the face of the membrane 120a that is adapted to be in contact with the column transmission line 11 can comprise one or several metallic contact dimples or the like and/or the face of the column transmission line 11 that is adapted to be in contact with the membrane 120a can comprises one or several metallic contact plots.

Figure 2:
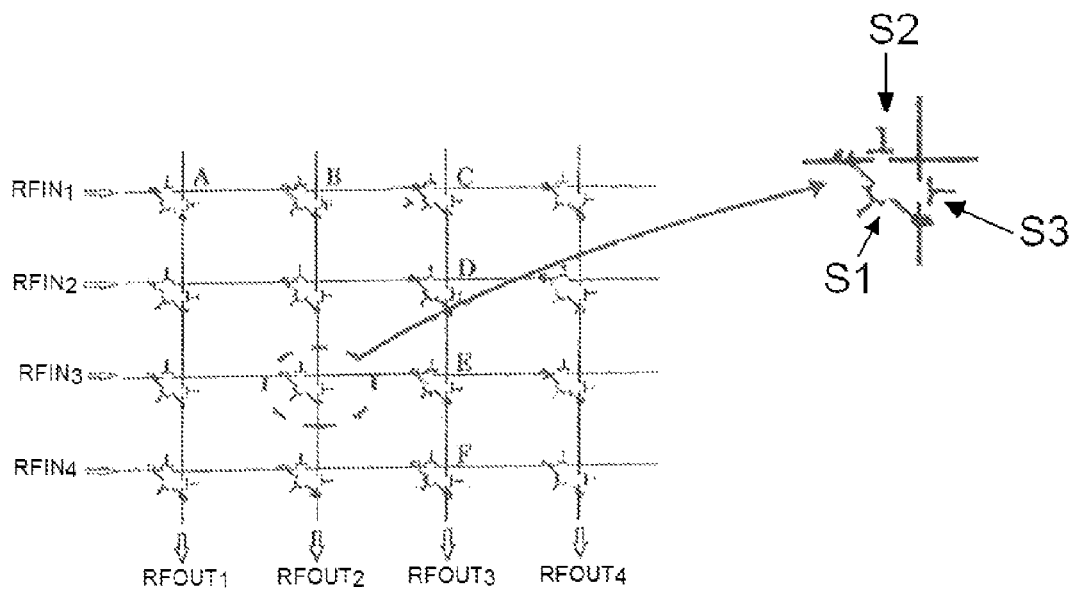
FIG. 2 is an example of implementation of a crosspoint switch matrix disclosed in the prior art, in particular in U.S. Pat. No. 6,888,420.

Referring to the crosspoint switch matrix of FIG. 1 comprising at each crosspoint a RF MEMS crosspoint switch $SW_{i,j}$ of the invention, all the RF MEMS crosspoint switch $SW_{i,j}$ of a row transmission line $RF-R_i$ form a non-interrupted RF signal path either in the ON-state or OFF-state positions and all the RF MEMS crosspoint switch $SW_{i,j}$ of a column transmission line $RF-C_j$ form a non-interrupted RF signal path either in the ON-state or OFF-state positions. For routing a RF signal for example from the input of row transmission line $RF-R_1$ to the output of column transmission line $RF-C_4$, the crosspoint switch $SW_{1,4}$ at the intersection of the lines $RF-R_1$ and $RF-C_4$ is actuated in its ON-state position and the signal meets only one time the ON-State resistance of the switch element 120, instead of seven times in the case of the implementation of the prior art depicted on FIG. 2. The insertion loss for the signal is thus advantageously reduced, and the invention enables to scale efficiently the crosspoint matrix to high M×N numbers. As the number of switching element for one crosspoint switch is also reduced by a factor 3 compared to the solution of the prior art (FIG. 2), the production yield is also greatly enhanced and the matrix control by a driver circuit is also greatly simplified.

The invention is not limited to the use of an anchorless flexible switch membrane 120a, but the switch element can be any mobile switch element that can be actuated in at least the ON-State and OFF-State positions previously described. In particular, the switch element is not necessarily flexible, although the use of a flexible switch element is preferred. The switch element can be also anchored to the substrate at one or more locations. In particular, the switch element can be anchored to the substrate at both ends, thus forming a bridge. The switch element can also be anchored to the substrate only at one end, and forms in this case a cantilever switch.

The invention is not limited to ohmic switch but can be also realized with capacitive switch.

Figure 5:
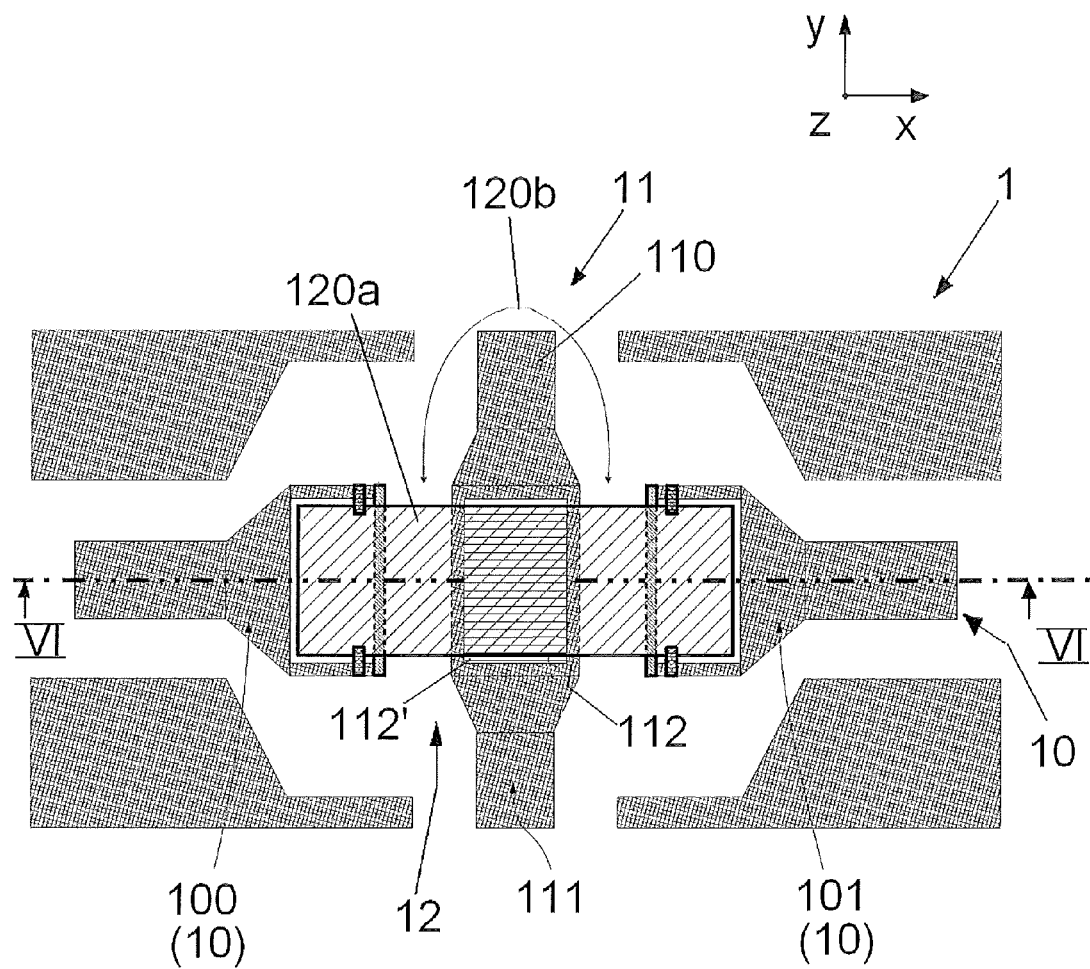
Figure 6A:
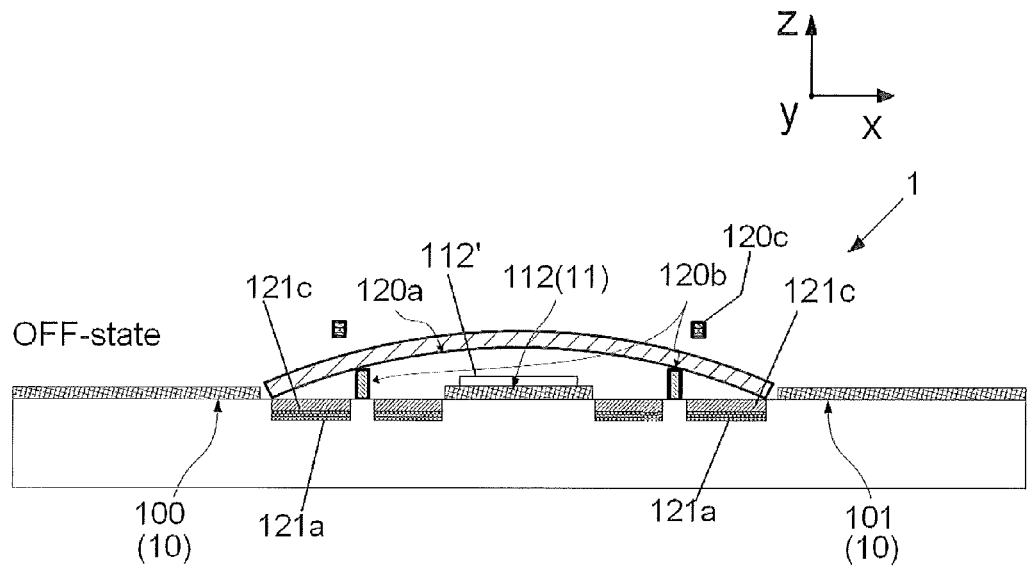
FIG. 6A is a view in cross section of the RF MEMS capacitive crosspoint switch of FIG. 5 in plane VI-VI, when the switch is in the OFF-State.
Figure 6B:
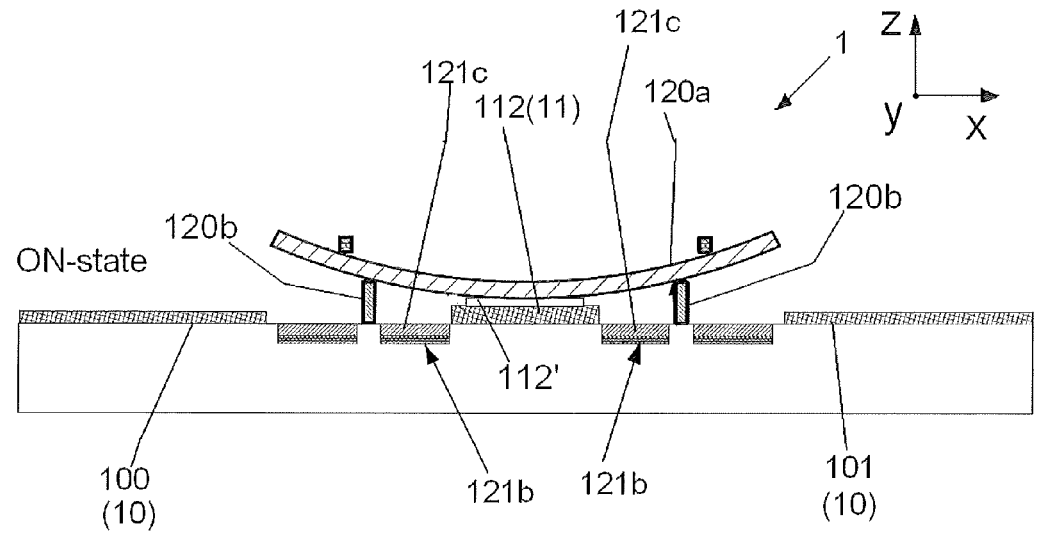
FIG. 6B is a view in cross section of the RF MEMS capacitive crosspoint switch of FIG. 5 in plane VI-IVI, when the switch is in the ON-State.

FIGS. 5, 6A and 6B show an example of RF MEMS crosspoint capacitive switch of the invention. This RF MEMS crosspoint capacitive switch differs essentially from the RF MEMS crosspoint ohmic switch of FIGS. 3, 4A and 4B by the use of a central conductor piece 112 of higher width whose top surface is covered by a thin dielectric insulating layer 112', thus creating metal-insulator-metal structure in the contact region of the membrane. The capacitance value C of this switch is given by the following formula:

$$C = \frac{\varepsilon_0 \cdot \varepsilon_r \cdot S}{h}$$

Where $\varepsilon_0$ is the vacuum permittivity, $\varepsilon_r$ is the dielectric insulating layer relative permittivity, h is the thickness of the dielectric insulating layer, and S is the area of the dielectric insulating layer.

The thin dielectric insulating layer 112' can be a solid material such as for example made of silicon nitride, silicone dioxide or aluminium oxide. The thin dielectric insulating layer 112' can be also replaced by vacuum, or by a gas layer (air or any gas).

The invention claimed is:

1. A RF MEMS crosspoint switch comprising a first transmission line and a second transmission line that crosses the first transmission line, wherein the first transmission line comprises two spaced-apart transmission line portions, and a switch element that permanently electrically connects the said two spaced-apart transmission line portions, wherein the second transmission line crosses the first transmission line between the two spaced-apart transmission line portions, the RF MEMS crosspoint switch further comprising actuation means for actuating the switch element at least between a first position, in which the switch element is electrically connecting the said two spaced-apart transmission line portions of the first transmission line and the first and second transmission lines are electrically disconnected, and a second position, in which the switch element is electrically connecting the said two spaced-apart transmission line portions of the first transmission line and is also electrically connecting the two transmission lines together.

2. The RF MEMS crosspoint switch of claim 1, wherein the switch element comprises a flexible membrane.

3. The RF MEMS crosspoint switch of claim 2, wherein the flexible membrane is supported by at least one pillar, and the membrane and the at least one pillar are forming a part of the first transmission line.

4. The RF MEMS crosspoint switch of claim 3, wherein the flexible membrane is anchorless and can freely slide relatively to the at least one pillar during its bending movement.

5. The RF MEMS crosspoint switch of claim 1, wherein the switch element is anchored to the substrate.

6. The RF MEMS crosspoint switch of claim 5 wherein the switch element is anchored to the substrate at both ends and forms a bridge.

7. The RF MEMS crosspoint switch of claim 5, wherein the switch element is anchored to the substrate at only one end and forms a cantilever switch element.

8. The RF MEMS crosspoint switch of claim 1, wherein the actuation means is adapted to bend down the switch element into a down forced state corresponding the second position.

9. The RF MEMS crosspoint switch of claim 1, wherein the actuation means is adapted to bend up the switch element into an up forced state corresponding to the first position.

10. The RF MEMS crosspoint switch of claim 1, wherein the switch element is adapted to provide an ohmic contact with the second transmission line.

11. The RF MEMS crosspoint switch of claim 1, wherein the switch element is adapted to provide a capacitive coupling with the second transmission line.

12. A RF MEMS switch matrix comprising several row transmission lines, and several column transmission lines, that cross the row transmission lines, and comprising at each crosspoint a RF MEMS crosspoint switch according to claim 1.

13. The use of the RF MEMS switch matrix of claim 12 for routing RF signals.

* * * * *